United States Patent [19]

Lüthe et al.

[11] 4,086,812
[45] May 2, 1978

[54] DISPLAY DEVICE

[75] Inventors: Helmut Lüthe; Otto Schönemann, both of Wolfsburg, Germany

[73] Assignee: Volkswagenwerk Aktiengesellschaft, Germany

[21] Appl. No.: 776,539

[22] Filed: Mar. 11, 1977

[30] Foreign Application Priority Data

Apr. 6, 1976 Germany .............................. 2614712

[51] Int. Cl.² ............................................ G01F 23/10
[52] U.S. Cl. ........................................ 73/308; 73/313; 73/362 AR; 340/332
[58] Field of Search ................... 73/308, 313, 362 AR; 340/332, 225

[56] References Cited

U.S. PATENT DOCUMENTS

| 3,765,006 | 10/1973 | Takahashi | 340/248 A |
| 3,918,035 | 11/1975 | Eshraghian | 340/244 |
| 3,953,806 | 4/1976 | Veranth | 340/332 |

Primary Examiner—S. Clement Swisher
Attorney, Agent, or Firm—Brumbaugh, Graves, Donohue & Raymond

[57] ABSTRACT

A display device for indicating the value of a measured quantity includes a plurality of display elements, each representative of a primary value range. A driving circuit is responsive to a sensor output signal and activates individual ones of the display elements when the sensor output has a value representative of one of the primary value ranges of the measured quantity, and activates adjacent display elements simultaneously when the sensor output signal represents intermediate value ranges of the quantity.

6 Claims, 3 Drawing Figures

DISPLAY DEVICE

BACKGROUND OF THE INVENTION

This invention relates to display devices and particularly to display devices for indicating the condition of sensors in a vehicle.

Most automobiles include instruments for indicating the value of various measured quantities, such as the amount of fuel in the fuel tank, the engine coolant temperature, and the engine oil pressure. It is particularly important that such instruments be easily read in a short period by the vehicle operator. Conventional mechanical gauges are often difficult to read rapidly and are difficult to construct for accurate and reliable operation in an automobile environment, where they are subjected to considerable vibration over an extended operating lifetime. As a result, these instruments are generally not particularly accurate.

Published German Patent Application No. 2,242,216 discloses an electronic display apparatus for a motor vehicle which overcomes some disadvantages of mechanical displays and makes use of liquid crystal display elements embedded in the automobile windshield. In order to obtain a significant range of displayed values, a large number of such display elements is required. Another disadvantage of this prior technique is that the liquid crystal display elements are difficult to see under poor lighting conditions and therefore difficult for the driver to read when the vehicle is being operated at night.

It is therefore an object of the present invention to provide a new and improved electronic display apparatus for use in a motor vehicle.

It is a further object of the invention to provide such an apparatus which gives an accurate display of the measured quantity in a large number of value ranges with a minimum number of display elements.

It is a further object of the invention to provide such an apparatus wherein the vehicle operators' attention is easily attracted when the displayed quantity reaches a critical value.

SUMMARY OF THE INVENTION

In accordance with the present invention, there is provided an apparatus for displaying the value of a measured quantity for use in connection with a sensor element having an output signal representative of the quantity. The display apparatus includes an indicating unit having a plurality of variously colored luminous display elements, each representative of a primary value range of the quantity. A display driving unit, responsive to the sensor output signal, activates individual ones of the diodes when the sensor output signal represents selected primary value ranges of the quantity and activates adjacent ones of the diodes simultaneously when the sensor output signal represents selected intermediate value ranges of the quantity.

The display elements are preferably light emitting diodes. A flasher circuit may be included in the display driving unit for flashing one of the light emitting diodes when the measured quantity reaches a critical value. In one embodiment, the display driving unit includes at least a first threshold value switch responsive to the lowest value in the highest value range and a second threshold value switch responsive to the highest value in the lowest value range. The display device may be used to indicate the level of fuel remaining in a vehicle fuel tank, in which case the light emitting diodes may be arranged vertically within the outline of a gasoline pump. The display unit may also be used to indicate engine coolant temperature, in which case the light emitting diodes may be arranged vertically within the outline of a thermometer.

For a better understanding of the present invention, together with other and further objects, reference is made to the following description, taken in conjunction with the accompanying drawings, and its scope will be pointed out in the appended claims.

DESCRIPTION OF THE INVENTION

Figure 1:
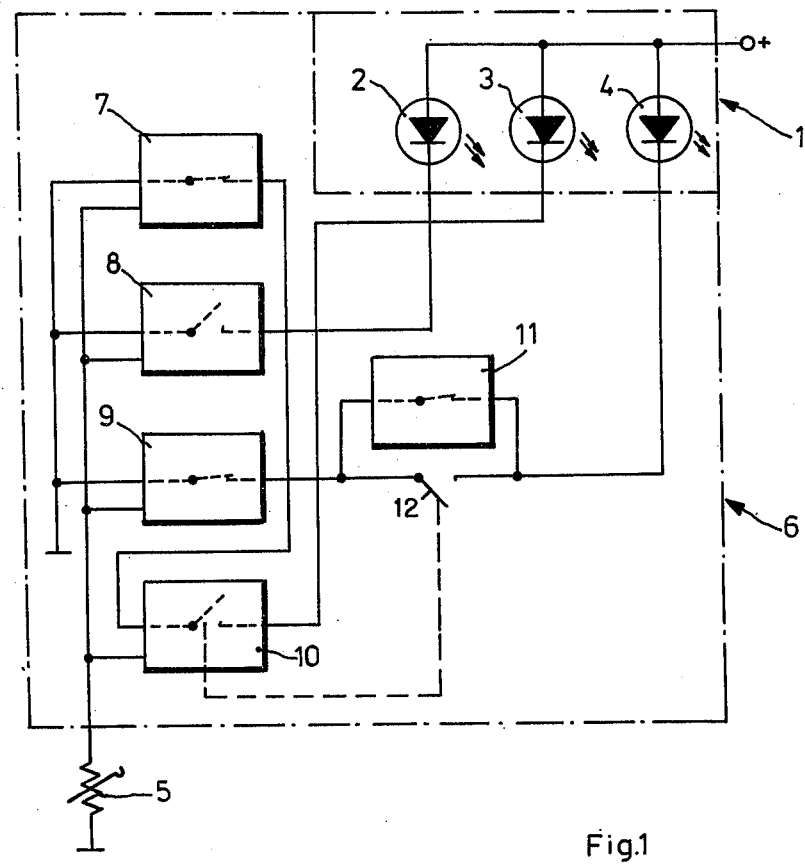
FIG. 1 is a schematic diagram of a display device in accordance with the present invention.

FIG. 1 is a schematic diagram of a display device in accordance with the invention. The display device is responsive to a sensing element 5, which may be a float gauge in a vehicle fuel tank or a temperature or pressure sensing element in a vehicle engine. The display itself consists of a display unit 1 which includes a plurality of light emitting diodes 2, 3, and 4, which are used as the actual display elements. The light emitting diodes 2, 3, and 4 are driven by a display driving unit 6 which serves to convert the output signal of sensor unit 5 into suitable electrical signal for activating the light emitting diodes 2, 3, and 4.

Driver unit 6 includes four threshold value switches 7, 8, 9, and 10, which may be for example, Thompson CSF Type SFC 2458 DC operational amplifiers. These threshold value switches are each configured to respond, by either opening or closing, to a different value of the output signal from sensor assembly 5. Threshold value switches 7 and 9 are normally closed in the absence of a signal greater than their threshold value. Threshold value switches 8 and 10 are normally open in the absence of a signal greater than their threshold value. Driver circuit 6 also includes a flasher circuit 11 of conventional design, for example a thermal relay, and an auxiliary switch 12 which is activated by the closing of threshold value switch 10.

The operation of the driver circuit 6 may be explained by indicating the operation of the various components as the level of fuel in a fuel tank is increased from empty to full. When the fuel tank is completely empty, the output signal from sensor 5 assumes its lowest value. In this case, switches 8, 10, and 12 are open and only diode 4 is connected through switch 9 and flasher 11. Diode 4 will then continuously flash on and off to indicate that the amount of fuel in the tank is below the reserve level of fuel. The flashing of diode 4, which is preferably a red diode will easily attract the driver's attention to the fact that the fuel tank is empty.

As the level of fuel in the tank is increased to the reserve level, the output of sensor unit 5 increases to the threshold value of switch 10. When switch 10 closes, it also closes switch 12 bypassing flasher circuit 11, and diode 4 remains continuously illuminated. Closing of switch 10 also connects diode 3 thereby illuminating both diodes 3 and 4 indicating the presence of a reserve quantity of fuel. Diode 3 is suitably of a yellow color.

A further increase in the quantity of fuel in the fuel tank to a quarter tank will cause the output signal from sensor 5 to reach the threshold value of switch 9. Switch 9 is appropriately configured to open when the sensor output signal indicates appropriately a quarter tank. The opening of switch 9 disconnects current to diode 4 causing that diode to be extinguished. Diode 3 remains illuminated indicating at least a quarter tank of fuel.

Further increase in the level of fuel in the fuel tank to a half tank causes the closing of switch 8 when the output signal from sensor 5 reaches an appropriate level. This switch causes the illumination of diode 2, which may be appropriately a green light emitting diode. Diode 3 remains illuminated until the level of fuel in the tank reaches three quarters of a tank in which case the output from sensor 5 reaches a level appropriate to open switch 7. At this point, diode 3 is extinguished and only green diode 2 remains illuminated.

The use of light emitting diodes as a display device renders the device easily readable to the vehicle operator. These devices are relatively inexpensive and provide sufficient illumination for rapid instrument reading. The diodes are available in a variety of colors according to the doping of the semiconductor used, thereby increasing readability. Use of the circuit indicated for driving the light emitting diodes makes it possible to provide an indication of intermediate values of the quantity to be displayed. In the circuit illustrated, five levels of fuel tank content may be displayed by the use of only three diodes. By the use of a similar circuit it is possible to display three values of a quantity with the use of only two light emitting diodes or display a larger number of value ranges with a larger number of display elements.

Figure 2:
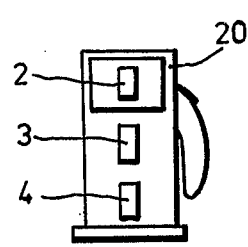
FIG. 2 illustrates an arrangement of light emitting diodes in a display for indicating fuel tank content.

If the display is to represent fuel tank content, a red diode is appropriately used to indicate a near empty tank; a yellow diode to represent an intermediate level; and a green diode to represent a full tank. An appropriate and attractive arrangement of the diodes for displaying fuel quantity is shown in FIG. 2 wherein the three diodes 2, 3, and 4 are arranged within the outline 20 of a fuel pump.

Figure 3:
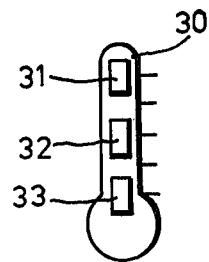
FIG. 3 illustrates an arrangement of light emitting diodes in a configuration for indicating engine temperature.

FIG. 3 illustrates an appropriate display configuration for three diodes 31, 32, and 33 when the measured quantity to be indicated is engine coolant temperature. In a temperature display, it is appropriate that the red diode 31 be used to indicate excess engine temperature; a green diode 32 may be used to indicate normal operating temperature; and a yellow diode 22 be used to indicate subnormal temperature. In this display, it is appropriate to provide a flasher circuit in connection with red diode 31 for activation when overheating occurs. Engine temperature may be appropriately displayed by arranging the diodes vertically within the outline 30 of a thermometer.

As an alternate to the use of switches 7 through 10 in the driver circuit, it is possible to use gate circuits as amplitude range discriminators in the manner disclosed in U.S. Pat. No. 3,728,627. The output of the range discriminators can be used to drive the diodes, and intermediate values may be obtained by having overlapping discriminator ranges, resulting in simultaneous driving of adjacent diodes.

It will be evident that display devices other than light emitting diodes may be used in the present invention. Such other devices should be luminous and available in a variety of colors to facilitate an easy reading of the dispaly device.

While there has been described what is believed to be the preferred embodiment of the present invention, those skilled in the art will recognize that other and further modifications may be had thereto without departing from the true spirit and scope of the invention, and it is intended to cover all such embodiments as fall within the true scope of the invention.

We claim:

1. Apparatus for displaying the value of a measured quantity, for use in connection with a sensor element having an output signal representative of said quantity, comprising an indicating unit having a plurality of variously colored luminous display elements, each representative of a primary value range of said quantity, and display driving means, responsive to said sensor output signal, for activating individual ones of said display elements when said sensor output signal represents selected primary value ranges of said quantity and for activating adjacent ones of said display elements simultaneously when said sensor output signal represents intermediate value ranges of said quantity.

2. Apparatus as specified in claim 1 wherein said display driving means includes a flasher circuit connected to one of said display elements for signaling a critical value of said quantity.

3. Apparatus as specified in claim 1 wherein said display driving means includes a first threshold value switch responsive to the lowest value in the highest value range of said quantity and a second threshold value switch responsive to the highest value in the lowest value range of said quantity.

4. Apparatus as specified in claim 1 wherein said sensor output signal is representative of the quantity of fuel in a fuel tank and wherein said display elements are arranged vertically within an outline of a fuel pump.

5. Apparatus as specified in claim 1 wherein said sensor output signal is representative of engine coolant temperature and wherein said display elements are arranged vertically within an outline of a thermometer.

6. Apparatus for displaying the value of a measured quantity, for use in connection with a sensor element having an output signal representative of said quantity, comprising an indicating unit having a plurality of variously colored luminous display elements, each representative of a primary value range of said quantity, and display driving means, responsive to said sensor output signal, for activating individual ones of said display elements when said sensor output signal represents selected primary value ranges of said quantity and for activating adjacent ones of said display elements simultaneously when said sensor output signal represents intermediate value ranges of said quantity, said driving means including a plurality of threshold value switches, the number of said switches being one less than the total number of said primary and intermediate value ranges, said switches opening or closing at signal values equal to the boundary values between adjacent ranges, alternate ones of said switches being normally open switches and normally closed switches respectively closing to activate and opening to extinghish one of said display elements when said signal attains the corresponding threshold value for each switch.

* * * * *